(12) United States Patent
Park et al.

(10) Patent No.: US 7,411,243 B2
(45) Date of Patent: Aug. 12, 2008

(54) NONVOLATILE SEMICONDUCTOR DEVICE AND METHOD OF FABRICATING THE SAME

(75) Inventors: Young-Sam Park, Suwon-si (KR); Seung-Beom Yoon, Suwon-si (KR); Jeong-Uk Han, Suwon-si (KR); Sung-Taeg Kang, Seoul (KR); Seung-Jin Yang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 470 days.

(21) Appl. No.: 11/214,247

(22) Filed: Aug. 29, 2005

(65) Prior Publication Data

US 2006/0046388 A1    Mar. 2, 2006

Related U.S. Application Data

(60) Provisional application No. 60/605,253, filed on Aug. 27, 2004.

(30) Foreign Application Priority Data

Sep. 9, 2004    (KR) ...................... 10-2004-0072189

(51) Int. Cl.
    *H01L 29/76*    (2006.01)
    *H01L 29/788*    (2006.01)

(52) U.S. Cl. ............... 257/315; 257/317; 257/E29.129; 257/E29.3; 257/E21.179; 257/E21.422; 438/201; 438/211

(58) Field of Classification Search ......... 257/314–317, 257/321, 324, E29.129, E29.3, E21.179, 257/E21.422, E21.68; 438/201, 211, 257
See application file for complete search history.

(56) References Cited

U.S. PATENT DOCUMENTS 7,005,700 B2 * 2/2006 Lee ............................ 257/316

FOREIGN PATENT DOCUMENTS

| JP | 03031705 | 1/2003 |
| KR | 100431489 | 3/2004 |

OTHER PUBLICATIONS

English Abstract***.

* cited by examiner

*Primary Examiner*—Hoai V Pham
(74) *Attorney, Agent, or Firm*—F. Chau & Assoc., LLC

(57) ABSTRACT

A nonvolatile semiconductor device and a method of fabricating the same are provided. The nonvolatile semiconductor device includes a semiconductor body formed on a substrate to be elongated in one direction and having a cross section perpendicular to a main surface of the substrate and elongated direction, the cross section having a predetermined curvature, a channel region partially formed along the circumference of the semiconductor body, a tunneling insulating layer disposed on the channel region, a floating gate disposed on the tunneling insulating layer and electrically insulated from the channel region, an intergate insulating layer disposed on the floating gate, a control gate disposed on the intergate insulating layer and electrically insulated from the floating gate, and source and drain regions which are aligned with both sides of the control gate and formed within the semiconductor body.

43 Claims, 13 Drawing Sheets

NONVOLATILE SEMICONDUCTOR DEVICE AND METHOD OF FABRICATING THE SAME

CROSS-REFERENCE TO RELATED APPLICATIONS

This application claims priority from Korean Patent Application No. 10-2004-0072189 filed on Sep. 9, 2004, and U.S. Provisional Patent Application No. 60/605,253 filed on Aug. 27, 2004, the disclosures of both applications are incorporated by reference herein.

BACKGROUND OF THE INVENTION

1. Field of the Invention

The present invention relates to a nonvolatile semiconductor device and a method of fabricating the same, and more particularly, to a nonvolatile semiconductor device for preventing electric field accumulation and having improved electrical properties, and a method of fabricating the same.

2. Description of the Related Art

Scaling (shrinking) is a continuing process in the manufacture and design of nonvolatile semiconductor devices, wherein device feature sizes continue to decrease to increase switching speed, to achieve high performance, and to reduce power consumption while maintaining a high drive capacity.

One scaling technology that has been proposed for increasing the density of a semiconductor device is a multi-gate transistor having a fin-shaped silicon body formed on a silicon-on-insulator (SOI) wafer and a gate formed on the surface of the fin-shaped silicon body (e.g., Fu-Liang Yang et al., "35 nm CMOS FinFETs", Symposium on VLSI Technology Digest of Technical Papers, pp. 104-105, 2002; and B. S. Doyle et al., "High Performance Fully-Depleted Tri-gate CMOS Transistors", IEEE Electron Device Letters, Vol. 24, No. 4, April, 2003, pp. 263-365).

When a nonvolatile semiconductor device is made of a multi-gate transistor, a three-dimensional channel is used in the scaling technology. Further, the sub-threshold characteristic and the current control capacity can be improved without increasing the gate length by employing a complete depletion SOI structure. In addition, a short channel effect (SCE), in which the electric potential of the channel region is affected by the drain voltage, can be suppressed. In particular, a tri-gate structure using channels formed on three planes of a semiconductor body is beneficial in terms of a large design error allowance with respect to the width and height of the semiconductor body.

However, the electric field is not uniform in all three planes of the semiconductor body in the tri-gate structure, but it is concentrated at the corners of the semiconductor body. The semiconductor body has a rectangular cross section produced by dry etching a semiconductor layer. The electric field is concentrated at the corners of this rectangular cross section and the threshold voltage at the corners is low. Accordingly, the channel forms faster at the corners than other portions so that the switching characteristic is degraded there. Further, when an oxide layer, a polysilicon layer, a nitride layer, and others are formed on the semiconductor body, the respective layers are formed on {100} and {110} crystal planes at different formation speeds, resulting in serious non-uniformity of the characteristics of the nonvolatile semiconductor device.

Meanwhile, when the semiconductor body having channels formed on a plurality of planes is fabricated by dry etching, it is highly probable that charge carriers are created within an insulating layer formed on the semiconductor body by damage due to plasma generated during the dry etching. Further, surface roughness of the semiconductor body may deteriorate, resulting in a reduction in carrier mobility.

SUMMARY OF THE INVENTION

The present invention provides a nonvolatile semiconductor device for preventing an electric field accumulation and having improved electrical properties.

The present invention also provides a method of fabricating a nonvolatile semiconductor device for preventing an electric field accumulation and having improved electrical properties.

According to an aspect of the present invention, there is provided a nonvolatile semiconductor device including a semiconductor body elongated in one direction on a substrate and having a cross section perpendicular to a main surface of the substrate and elongated direction, the cross section having a predetermined curvature, a channel region partially formed within the semiconductor body along the circumference of the semiconductor body, a tunneling insulating layer disposed on the channel region, a floating gate disposed on the tunneling insulating layer and electrically insulated from the channel region, an intergate insulating layer disposed on the floating gate, a control gate disposed on the intergate insulating layer and electrically insulated from the floating gate, and source and drain regions which are aligned with both sides of the control gate and formed within the semiconductor body.

According to another aspect of the present invention, there is provided a nonvolatile semiconductor device including a semiconductor body formed to be elongated in one direction over an oxide layer fin formed on a substrate and having a cross section perpendicular to a main surface of the substrate and elongated direction, the cross section having a predetermined curvature, a channel region partially formed within the semiconductor body along the circumference of the semiconductor body, a tunneling insulating layer disposed on the channel region, a floating gate disposed on the tunneling insulating layer and a sidewall of the oxide layer fin and electrically insulated from the channel region, an intergate insulating layer disposed on the floating gate, a control gate disposed along the intergate insulating layer and an upper portion of the substrate and electrically insulated from the floating gate, and source and drain regions aligned with both sides of the control gate to be disposed within the semiconductor body.

According to still another aspect of the present invention, there is provided a method of fabricating a nonvolatile semiconductor device including forming a semiconductor body on a substrate to be elongated in one direction and having a cross section perpendicular to a main surface of the substrate and elongated direction, the cross section having a predetermined curvature, forming a tunneling insulating layer on the semiconductor body, forming a floating gate, which is electrically insulated from the semiconductor body, on the tunneling insulating layer, forming an intergate insulating layer on the floating gate, forming a control gate, which is electrically insulated from the floating gate, on the intergate insulating layer, and forming source and drain regions, which are aligned with both sides of the control gate, within the semiconductor body.

According to yet another aspect of the present invention, there is provided a method of fabricating a nonvolatile semiconductor device including forming a semiconductor body on a substrate to be elongated in one direction and having a cross section perpendicular to a main surface of the substrate and elongated direction, the cross section having a predetermined curvature, forming a tunneling insulating layer on the semiconductor body, forming a floating gate, which is electrically insulated from the semiconductor body, on the tunneling insulating layer, forming an intergate insulating layer on the floating gate, forming a control gate, which is electrically insulated from the floating gate, on the intergate insulating layer, and forming source and drain regions, which are aligned with both sides of the control gate, within the semiconductor body.

BRIEF DESCRIPTION OF THE DRAWINGS

The above and other features of the present invention will become more apparent by describing in detail preferred embodiments thereof with reference to the attached drawings in which.

DETAILED DESCRIPTION OF PREFERRED EMBODIMENTS

Figure 1:
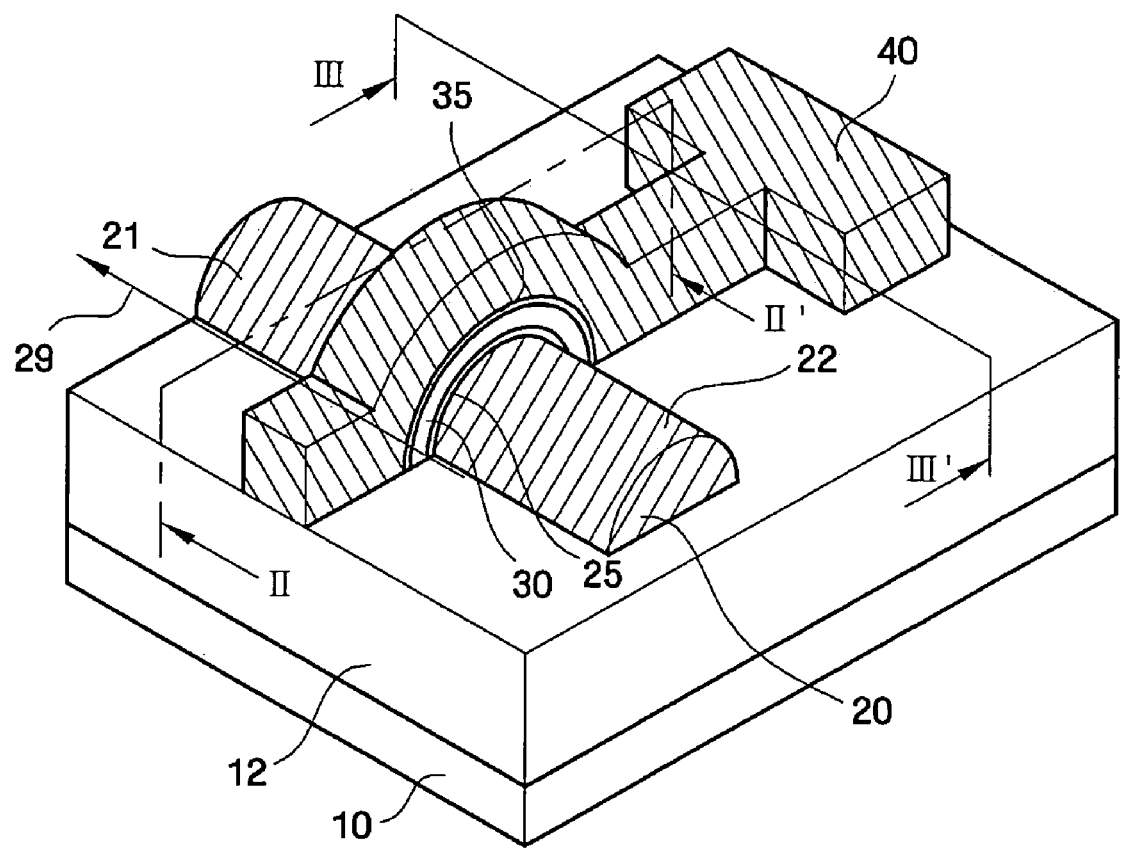
FIG. 1 is a perspective view showing a structure of a nonvolatile semiconductor device according to a first embodiment of the present invention.

Features of the present invention and methods of accomplishing the same may be understood more readily by reference to the following detailed description of the preferred embodiments and the accompanying drawings. Like reference numerals refer to like elements throughout the specification.

A transistor according to the present invention can be applied to volatile memory such as DRAM (Dynamic Random Access Memory) dr SRAM (Static Random Access Memory), nonvolatile memory such as EEPROM (Electrically Erasable Programmable Read-Only Memory) or flash memory devices, MEMS (Micro Electro Mechanical System) devices, optoelectronic devices, and display devices.

Figure 2:
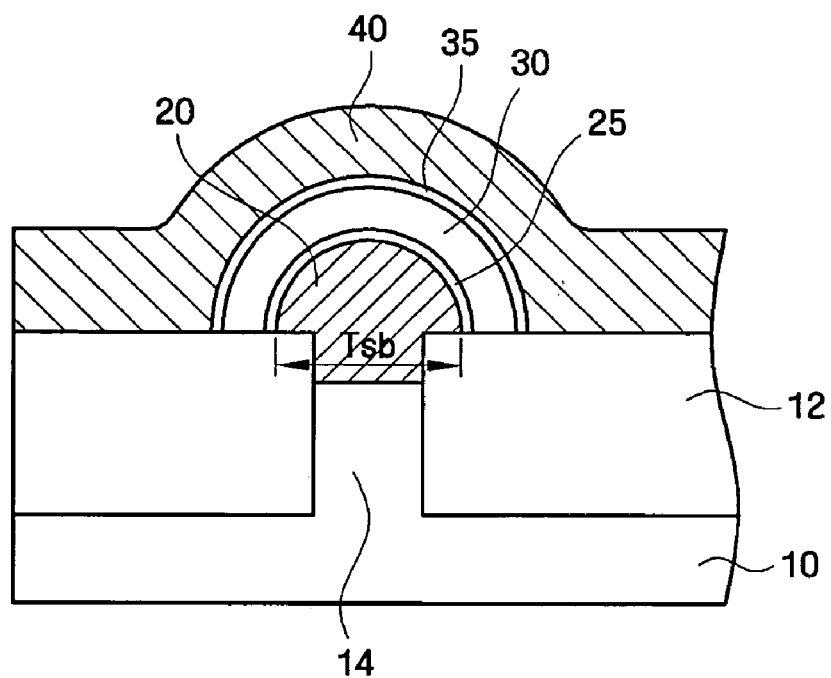
FIG. 2 is a cross-sectional view taken along a line II-II' of FIG. 1.

FIG. 1 is a perspective view showing a structure of a nonvolatile semiconductor device according to a first embodiment of the present invention; FIG. 2 is a cross-sectional view taken along a line II-II' of FIG. 1; and FIG. 3 is a cross-sectional view taken along a line III-III' of FIG. 1.

Figure 3:
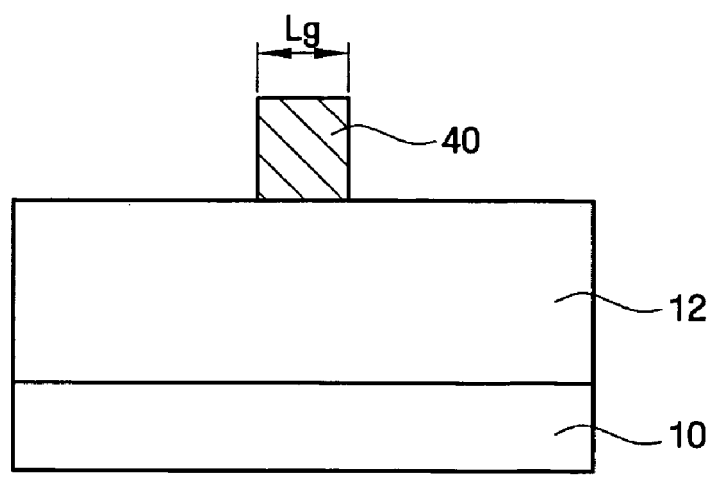
FIG. 3 is a cross-sectional view taken along a line III-III' of FIG. 1.

Referring to FIGS. 1 through 3, a nonvolatile semiconductor device according to a first embodiment of the present invention includes a substrate 10, a semiconductor body 20, a tunneling insulating-layer 25, a floating gate 30, an intergate insulating layer 35, a control gate 40, a source region 21 and a drain region 22.

The semiconductor body 20 is formed on the substrate 10 in a predetermined direction. Specifically, the semiconductor body 20 is formed on a semiconductor fin 14; s for example, on a silicon fin defined by device isolation regions 12. The device isolation regions 12 are disposed on both sides of a lower portion of the semiconductor body 20 to define a region of the semiconductor body 20.

The substrate 10 can be made of one or more semiconductor materials selected from the group consisting of Si, Ge, SiGe, GaP, GaAs, SiC, SiGeC, InAs and InP. Further, the substrate 10 may be a silicon-on-insulator (SOI) substrate. Particularly, the SOI substrate is used to improve a drain induced barrier lowering (DIBL) characteristic. Any substrate can be used as the SOI substrate as long as it is formed by a bonding technique or a SIMOX technique. The substrate 10 of FIGS. 1 and 3 is a bulk Si wafer that has a main surface whose crystal plane is a {100} plane.

The semiconductor body 20 is formed on the substrate 10 in an elongated direction 29. In particular, the semiconductor body 20 has a cross section at its circumference that is perpendicular to a main surface of the substrate 10 and to the elongated direction 29, which will be simply referred to as a "cross section" hereinafter The cross section of the semiconductor body 20 has a predetermined curvature. In the first embodiment of the present invention, the cross section of the semiconductor body 20, taken along the line II-II' shown in FIG. 1, is a plane. In alternative embodiments, the predetermined curvature can be a circle, a semi-circle organ oval, and it can be modified. Further, the curvature may not be uniform throughout but it may be irregular. The semiconductor body 20 may have various shapes according to the fabrication method, but a circle is preferred.

The semiconductor body 20 can be fabricated by selective epitaxial growth and annealing processes. Alternatively, the semiconductor body 20 can be fabricated by a method consisting of an undercut process and an annealing process in an existing structure in which channels are formed on three planes of a semiconductor body (e.g., a tri-gate structure). In either process, the semiconductor body 20 may have various geometrical shapes, and the circumference may be a curved plane having a predetermined curvature, which will now be described in more detail. When forming the semiconductor body 20 by the selective epitaxial growth and the annealing processes, an upper portion of the semiconductor body 20 having a curved circumference, a lower portion thereof is formed over a semiconductor fin 14 disposed between the device isolation regions 12 and filling a space between the device isolation regions 12.

If the semiconductor body 20 is arranged on the substrate 10 such that the cross section of the semiconductor body 20 has a predetermined curvature, that is, without a particular corner, an electric field is not concentrated in any portion of the semiconductor body 20. Accordingly, a threshold voltage reducing effect is not generated in any portion of the semiconductor body 20.

In a case where an oxide layer, a polysilicon layer, a nitride layer, and so on are formed on the semiconductor body 20, the non-uniformity in the characteristics of the nonvolatile semiconductor device due to a difference in formation speeds of the above layers does not occur.

In the first embodiment of the present invention, a thickness Tsb of the semiconductor body 20 is slightly smaller than a length Lg of the control gate 40, that is, Tsb<Lg. In an existing double-gate type semiconductor device, the relationship: Tsb<2Lg/3 is satisfied. In an ultra-thin semiconductor body SOI, the relationship: Tsb<Lg/3 is satisfied. The control of the control gate improves with increasing semiconductor body thickness Tsb. Accordingly, the nonvolatile semiconductor device according to the first embodiment of the present invention is excellent in the control of the control gate.

Figure 4:
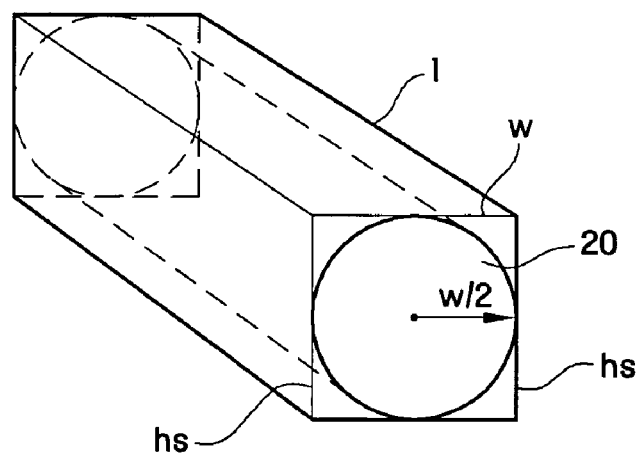
FIG. 4 shows a semiconductor body in a tri-gate structure.

In addition, when the thickness Tsb of the semiconductor body 20 is the same as the length Lg of the control gate 40, a wider channel region (the interface between the source region and the drain region) can be formed. FIG. 4 shows a semiconductor body in a tri-gate structure. In this embodiment of the present invention, it is preferred that the semiconductor body is a circle.

In a tri-gate structure, the channel regions are formed on both sidewalls of a semiconductor body 20 and on an upper surface parallel to a main surface of a substrate. Here, the height of the sidewall is denoted by hs, the width of the upper surface is denoted by w. A channel region is formed along the circumference of the semiconductor body 20. Assuming that the length 1 of the semiconductor body is constant, the length of the section of the channel region in the tri-gate structure is: w+2hs=w+2w=3w and the length of the section of the channel region is: $2\pi(w/2)=\pi w$. That is, a wider channel region is formed. Although a channel is not formed on a lower surface of the semiconductor body 20, a channel region having substantially the same area is formed thereon.

The semiconductor body 20 can be made of Si, Ge, $Si_{1-x}Ge_x$ (0<x<1), $Si_{1-x}C_x$ (0<x<1) or $Si_{1-x-y}Ge_xC_y$ (0<x<1, 0<y<1), GaAs, InSb, GaP or a combination thereof. To improve electrical properties of the nonvolatile semiconductor device, it is preferable that the semiconductor body 20 be formed using an ideal single crystalline film. In a device not necessitating relatively strict specifications such as a liquid crystal display (LCD), a polycrystalline film can be used.

The semiconductor body 20 is made of a material capable of improving the carrier mobility of the nonvolatile semiconductor device. For example, when using a Si wafer as the substrate 10, to improve the carrier mobility, that is, electron mobility, the semiconductor body 20 is preferably made of Si, $Si_{0.99}C_{0.01}$, and so on. In addition, when using a SiGe substrate as the substrate 10, the semiconductor body 20 is preferably made of Si, $Si_{0.99}C_{0.01}$, SiGe, and so on. Further, when using SiGe as the semiconductor body 20, the semiconductor body 20 is preferably made of SiGe such that a Ge content contained therein is lower than a Ge concentration of the SiGe substrate.

Although it is not shown in the drawings, the semiconductor body 20 can be formed of a plurality of different semiconductor layers. The plurality of semiconductor layers can be made of Si, Ge, $Si_{1-x}Ge_x$ (0<x<1), $Si_{1-x}C_x$ (0<x<1) or $Si_{1-x-y}Ge_xC_y$ (0<x<1, 0<y<1), GaAs, InSb, GaP or a combination thereof, respectively. For example, the semiconductor body 20 may be formed of two semiconductor layers. In such a case, a first semiconductor layer of the semiconductor body 20 can be a SiGe layer disposed on the SiGe substrate 10 and a second semiconductor layer, can be a Si layer disposed on the first semiconductor layer. In this case, the source and drain regions 21 and 22 formed within the semiconductor body 20 are formed of a plurality of semiconductor layers having different band gaps.

The tunneling insulating layer 25 is formed on the semiconductor body 20. That is, the tunneling insulating layer 25 is formed to surround the circumference of the semiconductor body 20. The tunneling insulating layer 25 electrically insulates the semiconductor body 20 from the floating gate 30. Even if the power supply is interrupted, carriers cannot dissipate because the semiconductor body 20 is electrically isolated, and therefore, data can be retained.

The tunneling insulating layer 25 can be made of $SiO_2$, SiON, $Si_3N_4$, $Ge_xO_yN_z$, $Ge_xSi_yO_z$ or a material having a high dielectric constant. Further, the tunneling insulating layer 25 can be made of a combination of the above materials; for example, a stacked structure in which two or more of the above materials are sequentially stacked. Here, the tunneling insulating layer 25 can be formed by dry oxidation at a temperature of about 1,000-1,100° C. using $O_2$ gas, wet oxidation in a vapor atmosphere at a temperature of about 1,000-1,100° C., HCl oxidation using an $O_2$/HCl gas mixture, oxidation using an $O_2/C_2H_3Cl_3$ gas mixture, oxidation using an $O_2/C_2H_2Cl_2$ gas mixture, and so on.

Further, the layer having a high dielectric constant is formed using $HfO_2$, $ZrO_2$, $Al_2O_3$, $Ta_2O_5$, hafnium silicate, zirconium silicate or a combination thereof by an atomic layer deposition (ALD) method. The high dielectric constant material is used to reduce the thickness of this layer.

The tunneling insulating layer 25 has a thickness of about 5-100 Å, and is preferably about 5-50 Å.

The floating gate 30 is formed on the tunneling insulating layer 25 and it traps carriers for storing data. That is, the floating gate 30 is formed to surround the circumference of the tunneling insulating layer 25. The floating gate 30 is formed of n+ polysilicon, p+ polysilicon, SiGe having a changeable work function, or a metallic material. In recent years, a nitride layer ($Si_3N_4$) has been typically used. In particular, a structure: tunneling insulating layer; floating gate; intergate insulating layer, in which: an oxide ($SiO_2$); Nitride ($Si_3N_4$); Oxide ($SiO_2$) are used, is referred to as an SONOS structure.

The floating gate 30 is normally formed to a, thickness of about 100-300 Å. When using the nitride layer ($Si_3N_4$), the floating gate 30 is formed to a thickness of about 10-200 Å.

The intergate insulating layer 35 is formed on the floating gate 30. That is, the intergate insulating layer 35 is formed to surround the circumference of the floating gate 30. The intergate insulating layer 35 electrically insulates the floating gate 30 from the control gate 40.

Like the tunneling insulating layer 25, the intergate insulating layer 35 may be made of $SiO_2$, SiON, $Si_3N_4$, $Ge_xO_yN_z$, $Ge_xSi_yO_z$, or a high dielectric constant material. Like the tunneling insulating layer 25, the intergate insulating layer 35 can be formed using wet oxidation, HCl oxidation, oxidation using a gas mixture, and so on.

Generally, the thickness of the intergate insulating layer 35 is slightly greater than that of the tunneling insulating layer 25. The intergate insulating layer 35 has a thickness of about 10-500 Å, and is preferably about 5-100 Å.

The control gate 40 is formed over the intergate insulating layer 35. That is, the control gate 40 is formed to surround the circumference of the intergate insulating layer 35. In particular, the control gate 40 is elongated to be perpendicular to the elongated direction 29. Further, the control gate 40 is formed to surround the circumference of the semiconductor body 20.

The control gate 40 can be made of conductive polysilicon, a metal such as W, Pt or Al, a metal nitride such as TiN, or a metal silicide made of a refractory metal such as Co, Ni, Ti, Hf, Pt, or a combination thereof. Further, the control gate 40 can be formed by sequentially stacking a conductive polysilicon layer and a metal silicide layer or sequentially stacking a conductive polysilicon layer and a metal layer.

The conductive polysilicon layer, which has been widely used, is formed using $SiH_2Cl_2$ and $PH_3$ gas by a low-pressure chemical vapor deposition (LPCVD) method. Generally, the control gate 40 is conformally formed according to a step coverage of the structure in which the semiconductor body 20, the floating gate 30, and so on, are stacked.

A channel region is formed within the semiconductor body 20 along the circumference by controlling the control gate 40. The gate width of a nonvolatile semiconductor device is the same as the length of the circumference of the semiconductor body of the nonvolatile semiconductor device.

As shown in FIG. 1, the source and drain regions 21 and 22 adjacent to sides of the control gate 40 are formed in the semiconductor body 20. The source and drain regions 21 and 22 are formed within the semiconductor body 20 using a single semiconductor layer. The source and drain regions 21 and 22 are doped with n-type or p-type impurities according to the type of the nonvolatile semiconductor device to be fabricated. Further, the source and drain regions 21 and 22 can include a lightly doped drain (LDD) region and a heavily doped drain (HDD) region. A spacer (not shown) can be formed on both sidewalls of the control gate 40.

Figure 5:
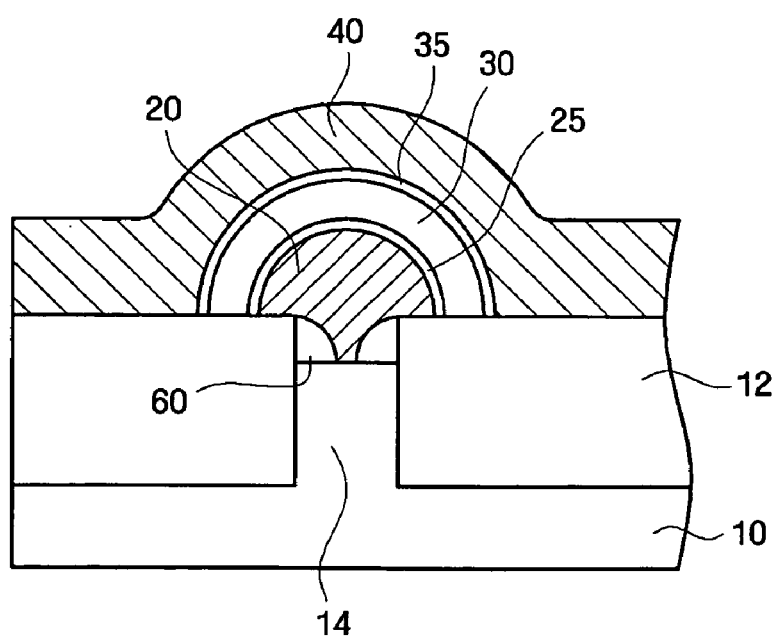
FIG. 5 is a cross-sectional view showing a structure of a nonvolatile semiconductor device according to a second embodiment of the present invention.

FIG. 5 is a cross-sectional view showing a structure of a nonvolatile semiconductor device according to a second embodiment of the present invention.

Referring to FIG. 5, the structure of the second embodiment is substantially similar to the first embodiment except that a blocking insulating layer 60 is formed between a substrate 10 and a semiconductor body 20.

The blocking insulating layer 60 is formed between the substrate 10 and the semiconductor body 20 to define a contact region between the substrate 10 and the semiconductor body 20. Although it has been shown in the second embodiment of the present invention that the blocking insulating layer 60 is formed on the sidewalls of the device isolation regions 12 in the form of a spacer, the invention is not limited thereto. The blocking insulating layer 60 can be made of silicon nitride, silicon oxide or a combination thereof.

Figure 6:
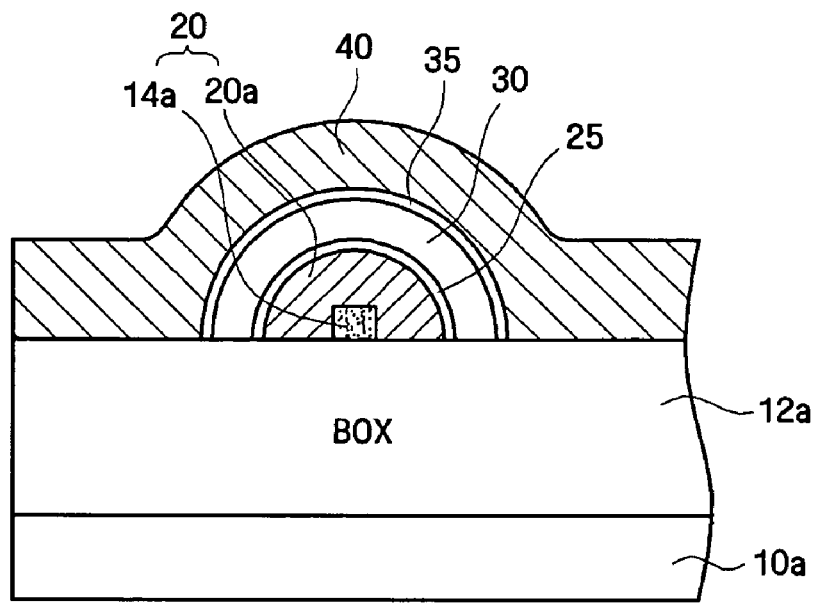
FIG. 6 is a cross-sectional view showing a structure of a nonvolatile semiconductor device according to a third embodiment of the present invention.

FIG. 6 is a cross-sectional view showing a structure of a nonvolatile semiconductor device according to a third embodiment of the present invention.

Referring to FIG. 6, the structure of the third embodiment is substantially similar to the first embodiment except that a semiconductor body 20 is formed on an SOI substrate.

The semiconductor body 20 of the third embodiment includes a silicon fin 14a formed on a buried oxide film 12a of an SOI substrate and a semiconductor layer 20a is formed on the silicon fin 14a by a selective epitaxial growth method.

Accordingly, source and drain regions (see 21 and 22 of FIG. 1) formed in a portion of the semiconductor body 20 are formed in the silicon fin 14a and the semiconductor layer 20a. While it has been described that the semiconductor layer 20a can be made of Si, Ge, $Si_{1-x}Ge_x$ (0<x<1), $Si_{1-x}C_x$ (0<x<1) or $Si_{1-x-y}Ge_xC_y$ (0<x<1, 0<y<1), GaAs, InSb, GaP or a combination thereof, the invention is not limited thereto.

Figure 7:
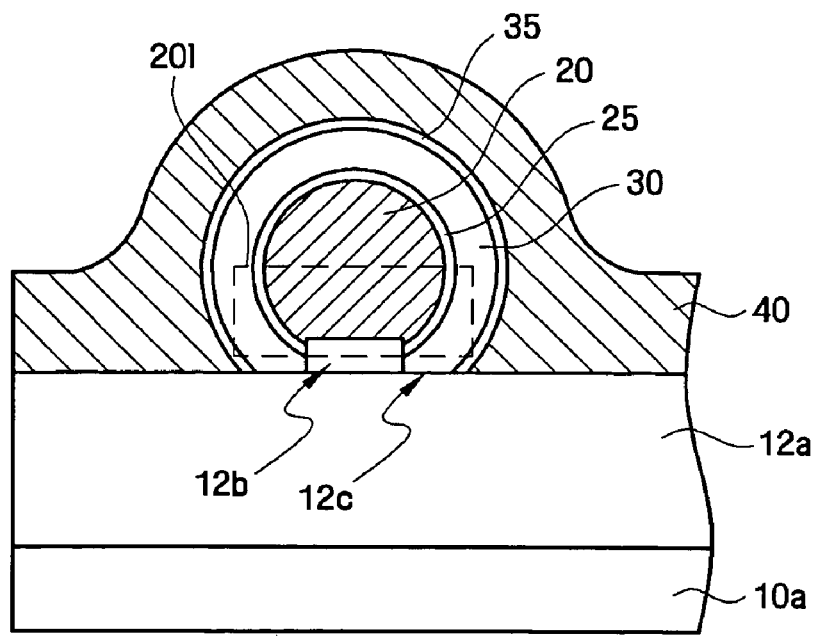
FIG. 7 is a cross-sectional view showing a structure of a nonvolatile semiconductor device according to a fourth embodiment of the present invention.

FIG. 7 is a cross-sectional view showing a structure of a nonvolatile semiconductor device according to a fourth embodiment of the present invention.

Referring to FIG. 7, a semiconductor body 20 is formed on an SOI substrate. Further, the semiconductor body 20 is substantially circular. Accordingly, the length of a cross section of the channel region of the fourth embodiment is longer than that of the channel region of the first to third embodiments. That is, a lower surface of the semiconductor body 20 according to the fourth embodiment is exposed to the outside to be controlled by a control gate 40, and the length of the channel region is increased by the length of the exposed lower surface.

The semiconductor body 20 can be circular or oval. Further, the curvature need not be regular throughout according to process conditions.

The semiconductor body 20 according to the fourth embodiment is formed by undercutting and annealing processes. In particular, a buried oxide film 12a on a lower portion of the semiconductor body 20 is wet etched to form an oxide layer fin 12b on the buried oxide film 12a. Accordingly, the semiconductor body 20 is formed on the oxide layer fin 12b.

Further, a tunneling insulating layer 25 surrounds the semiconductor body 20 and is preferably formed on both sidewalls of the oxide layer fin 12b. A floating gate 30 and/or an intergate insulating layer 35 can be formed on both sidewalls of the oxide layer fin 12b or on both sidewalls of the oxide layer fin 12b and on a portion of an upper portion 12c of the buried oxide film 12a. A control gate 40 is disposed along the floating gate 30 and the upper portion 12c of the buried oxide film 12a, and it is insulated from the floating gate 30 by the intergate insulating layer 35. The control gate 40 is formed to surround the semiconductor body 20.

In the above-described nonvolatile semiconductor devices according to at least one of the first to fourth embodiments of the present invention, the semiconductor body 20 has a cross section perpendicular to a main surface of the substrate and elongated-direction and the cross section has a predetermined curvature. Accordingly, an electric field concentrated in corners of the semiconductor body 20 can be well distributed, and the quality of the tunneling insulating layer 25 formed on the surface of the semiconductor body 20 is improved, thereby improving electrical properties of the semiconductor device.

FIGS. 8A through 8I are cross-sectional views illustrating steps in a method of fabricating the nonvolatile semiconductor device according to the second embodiment of the present invention.

Figure 8A:
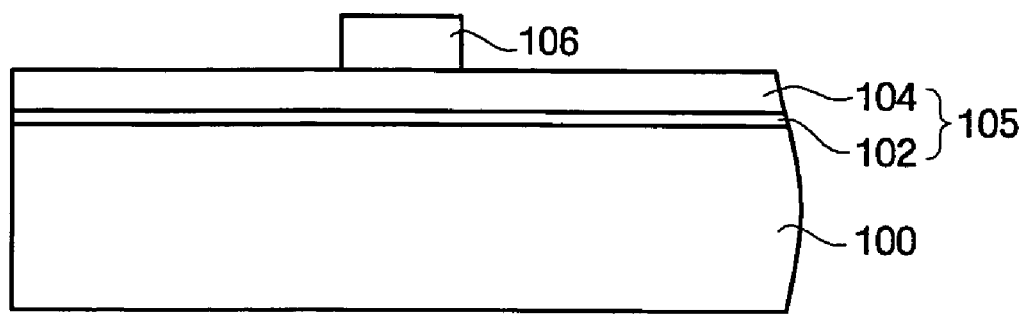
FIGS. 8A through 8I are cross-sectional views illustrating steps in a method of fabricating the nonvolatile semiconductor device according to the second embodiment of the present invention.

Referring to FIG. 8A, a substrate 100 is prepared. The substrate 100 can be made of one or more semiconductor materials selected from the group consisting of Si, Ge, SiGe, GaP, GaAs, SiC, SiGeC, InAs or InP. The substrate 100 can be a Si substrate whose upper surface is the {100} crystal plane.

A pad oxide layer 102 and a silicon nitride layer 104 are formed on the substrate 100 to form a hard mask layer 105. A photoresist pattern 106 defining a semiconductor body 120 is formed on the silicon nitride layer 104.

Figure 8B:
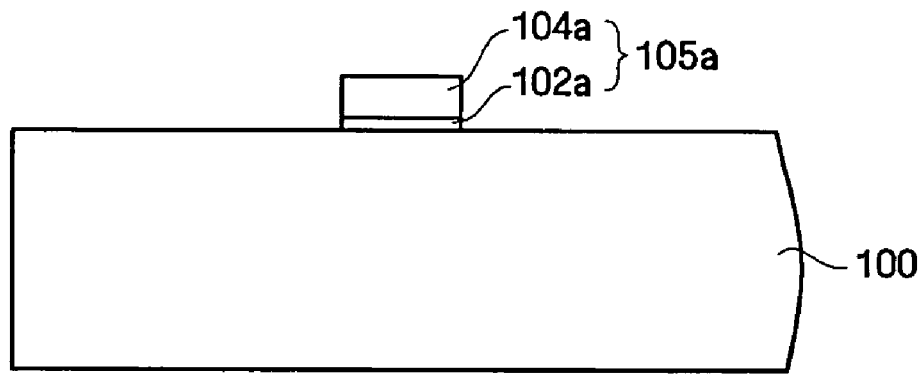

Referring to FIG. 8B, the silicon nitride layer 104 and the pad oxide layer 102 are is etched using the photoresist pattern 106 as an etching mask. As a result, a hard mask layer pattern 105a comprised of a pad oxide layer pattern 102a and a silicon nitride layer pattern 104a is formed. The photoresist pattern 106 is then removed so that an upper surface of the substrate 100 is exposed around the hard mask layer pattern 105a.

Figure 8C:
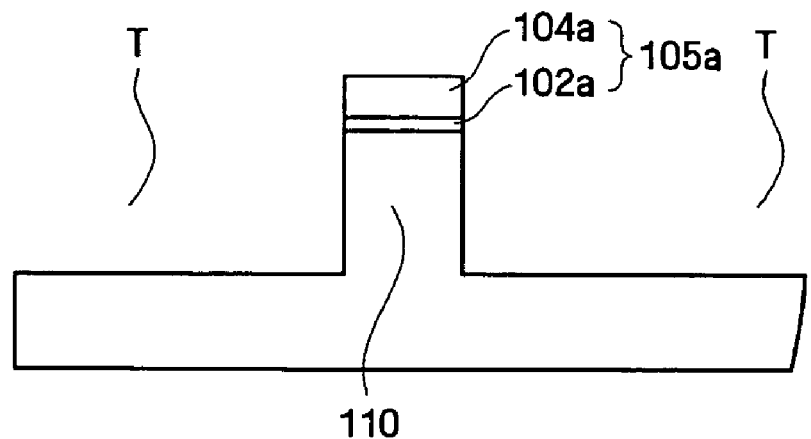

Referring to FIG. 8C, the exposed upper surface of the substrate 100 is etched using the hard mask layer pattern 105a as an etching mask. As a result, a trench T and a semiconductor fin 110 are formed on the substrate 100. The semiconductor fin 110 is defined by the trench T, which can be formed to a depth of 3,000-4,000 Å.

Figure 8D:
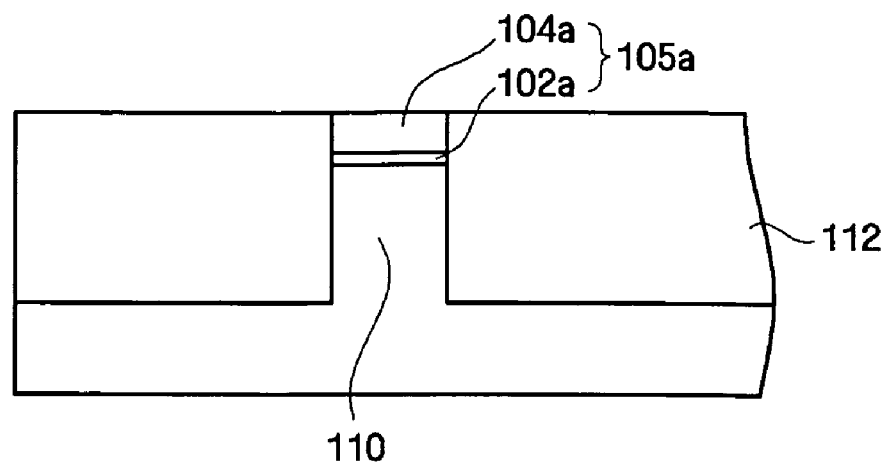

Referring to FIG. 8D, the trench T is filled with an insulating material such as an oxide to form a device isolation region 112 around the semiconductor fin 110.

Figure 8E:
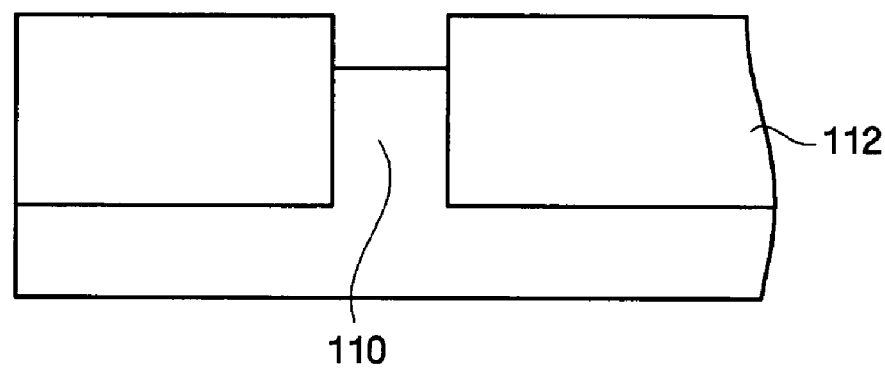
Figure 8F:
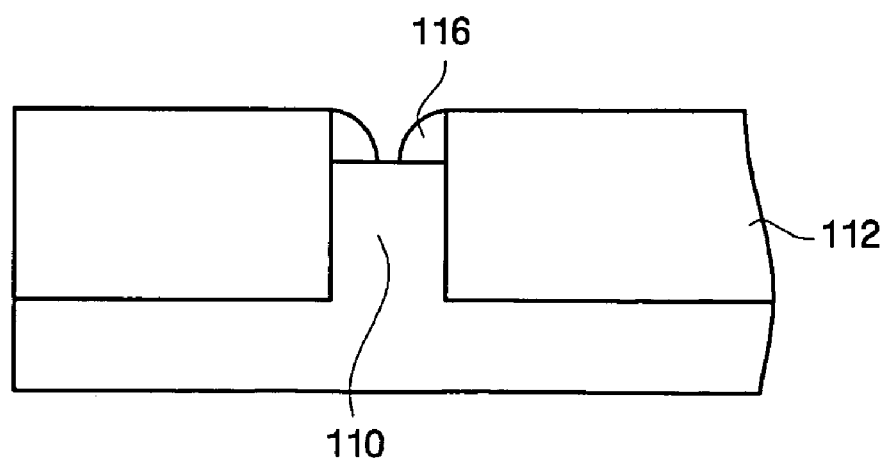

Referring to FIG. 8E, the silicon nitride layer pattern 104a and the pad oxide layer pattern 102a are removed. To this end, a wet etching method can be used. As a result, an upper surface of the semiconductor fin 110 is exposed. Referring to FIG. 8F, a blocking insulating layer 116 covering a portion of the upper surface of the semiconductor fin 110 is formed. The blocking insulating layer 116 can be made of silicon nitride, silicon oxide or a combination thereof.

The blocking insulating layer 116 can be shaped in the form of spacers formed on both sidewalls of the device isolation region 112. Specifically, an insulating material is first deposited on the entire surface of the resultant structure, and the resultant structure is then etched by an etch-back process to form the blocking insulating layer 116 in the form of the spacers on both sidewalls of the device isolation region 112.

As a result, a region with the narrow width defined by the blocking insulating layer 116 on the upper surface of the semiconductor fin 110 is exposed to the outside. The area of the semiconductor fin 110 exposed by the blocking insulating layer 116 is controlled by the width of the blocking insulating layer 116 in consideration of the degree of scaling of the device to be fabricated. In some cases, the formation process of the blocking insulating layer 116 may be omitted.

Figure 8G:
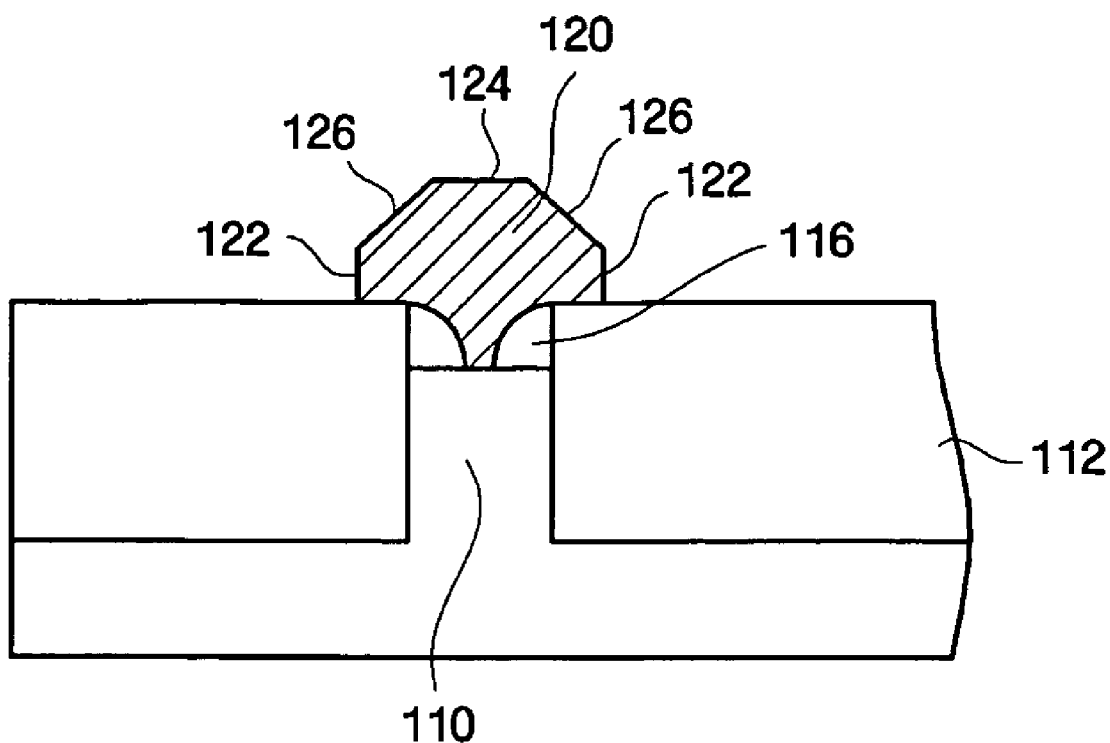

Referring to FIG. 8G, first, the substrate 100 to which the semiconductor fin 110 is exposed is cleaned using an RCA cleaning process, thereby removing surface impurities of the substrate 100. The selective epitaxial growth process is carried out on a semiconductor layer on the substrate 100 at a temperature of about 500-900° C. using the exposed narrow region of the semiconductor fin 110 as a seed layer to form the semiconductor body 120.

The surface of the semiconductor body 120 includes sidewalls 122 perpendicular to a main surface of the substrate 100, an upper surface i 24 parallel to the main surface of the substrate 100, and inclined planes 126 between the sidewalls 122 and the upper surface 124. The sidewalls 122, upper surface 124, and the inclined planes 126 face different directions.

To form the semiconductor body 120, a selective epitaxial growth process such as molecular beam epitaxy (MBE), ultra high vacuum-chemical vapor deposition (UHV-CVD), reduced pressure CVD (RPCVD) or rapid thermal CVD (RTCVD) can be used. For explanatory convenience, the second embodiment of the present invention is described using RPCVD.

The semiconductor body 120 can be made of Si, Ge, $Si_{1-x}Ge_x$ (0<x<1), $Si_{1-x}C_x$ (0<x<1) or $Si_{1-x-y}Ge_xC_y$ (0<x<1, 0<y<1), GaAs, InSb, GaP or a combination thereof.

$Si_2H_6$, $SiH_4$, $SiH_2Cl_2$, $SiHCl_3$, $SiCl_4$, and others can be used as the Si source gas to form the semiconductor body 120 by the selective epitaxial growth method. $GeH_4$ can be used as the Ge source gas. $C_2H_6$, $CH_3SiH_3$, and others can be used as the C source gas.

A gas such as HCl gas or $Cl_2$ gas can be added to the source gas to improve a characteristic of the selective epitaxial growth. If HCl gas or $Cl_2$ gas is added to the source gas, an epitaxial growth layer is not formed in a region where the oxide layer or the nitride layer is formed, but it is formed in a region where the semiconductor layer (for example, an Si layer) is exposed, thereby making it possible to carry out the selective epitaxial growth.

Specifically, when forming the semiconductor body 120, which is formed of a Si layer, crystal growth of the Si layer is carried out at a temperature of about 700-900° C. at a pressure of about 10-20 Torr. Here, $SiH_2Cl_2$ as a source gas is supplied at a flow rate of 100-200 sccm. HCl, $B_2H_6$ and $PH_3$ can be added to $SiH_2Cl_2$ gas at flow rates of 0-100 sccm. Here, an $H_2$ carrier gas can be supplied at 10-35 slm.

If the crystal growth is carried out at a temperature of about 800° C. or less, a {111} crystal plane is predominantly formed on the inclined plane 126 of the semiconductor body 120. Further, if the crystal growth temperature is about 800° C. or more, a {311} crystal plane is predominantly formed on the inclined plane 126 of the semiconductor body 120.

Accordingly, a growth temperature is set to about 700-800° C. to form the inclined plane 126 having a {111} crystal plane. The growth temperature is set to about 800-900° C. to form the inclined plane 126 having a {311} crystal plane.

When forming the semiconductor body 120 out of a $Si_{1-x}Ge_x$ layer, $Si_{1-x}Ge_x$ crystal growth is carried out at a temperature of about 500-750° C. at a pressure of about 10-20 Torr. Here, $SiH_2Cl_2$ and $GeH_4$ as source gases are supplied at flow rates of about 100-200 sccm and about 50-200 sccm, respectively. HCl, $B_2H_6$ and $PH_3$ can be added to the source gas at a flow rate of about 0-100 sccm. Here, an $H_2$ carrier gas can be supplied at about 10-35 slm.

When forming the semiconductor body 120 out of a $Si_{1-x}C_x$ layer, $Si_{1-x}C_x$ crystal growth is carried out at a temperature of about 650-850° C. and a pressure of about 10-20 Torr. Here, $SiH_2Cl_2$ and $CH_3SiH_3$ source gases are supplied at flow rates of about 100-200 sccm and about 5-50 sccm, respectively. HCl, $B_2H_6$ and $PH_3$ can be added to the source gas at a flow rate of about 0-100 sccm. Here, an $H_2$ carrier gas can be supplied at about 10-35 slm.

In the present embodiment, it has been described that the inclined plane 126 of the semiconductor body 120 is a plane in one direction, but the invention is not limited thereto. That is, the semiconductor body 120 can be formed to have the inclined plane 126 having different crystal planes. The inclined plane 126 can have a total of five planes facing different directions. Also, the inclined plane 126 can have a total of seven planes facing different directions.

When using the selective epitaxial growth method, the semiconductor body 120 in which channels are respectively formed in the five planes includes both sidewalls 122 perpendicular to the main surface of the substrate 100, an upper surface 124 parallel to the main surface of the substrate 100, and inclined planes 126 which are respectively elongated between the both sidewalls 122 and the upper surface 124 and formed of a {111} crystal plane or a {311} crystal plane. Further, although it is not shown in the drawings, a semiconductor body in which channels are respectively formed in seven planes includes both sidewalls perpendicular to a main surface of a substrate, an upper surface parallel to the main surface of the substrate, a first inclined plane formed of a {111} crystal plane, and a second inclined plane formed of a {311} crystal plane.

Figure 8H:
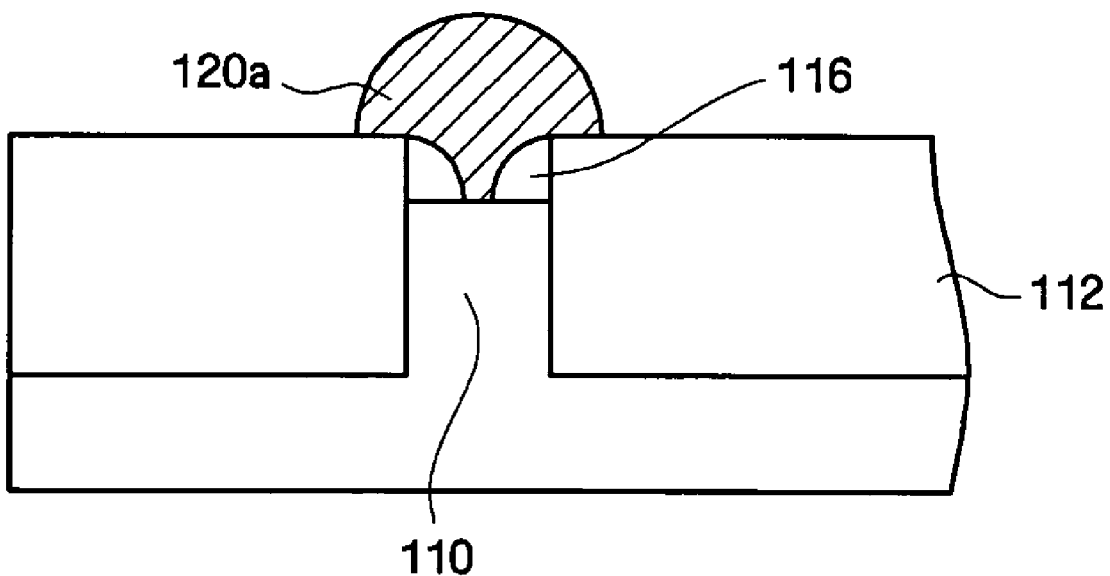

Referring to FIG. 8H, an annealing process is performed on the resultant structure of FIG. 8G, so that the semiconductor body 120 is rounded, thereby forming a semiconductor body 120a having a cross section of a predetermined curvature. Preferably, the annealing process is performed in an $H_2$ atmosphere at a temperature of about 850-950° C.

In FIG. 8G, as the number of the inclined planes of the semiconductor body 120 increases, it is easier to form the semiconductor body 120 having a cross section of a predetermined curvature. Further, after performing the annealing process, a lower portion of the semiconductor body 120a can be undercut. In this case, the cross section of the semiconductor body 120a is substantially circular.

Although the present embodiment has shown and described that the semiconductor body 120a is formed of a semiconductor layer having a single composition, the invention is not limited thereto. That is, the semiconductor body 120a can be formed of a plurality of semiconductor layers having different band gaps.

For example, to form the semiconductor body 120a, a SiGe layer is first formed on the semiconductor fin 110 by the selective epitaxial growth method, and a Si layer is then grown over the SiGe layer, and then the annealing process is performed. A buried channel is formed in the semiconductor body 120 at a hetero-interface between two kinds of semiconductor layers.

Figure 8I:
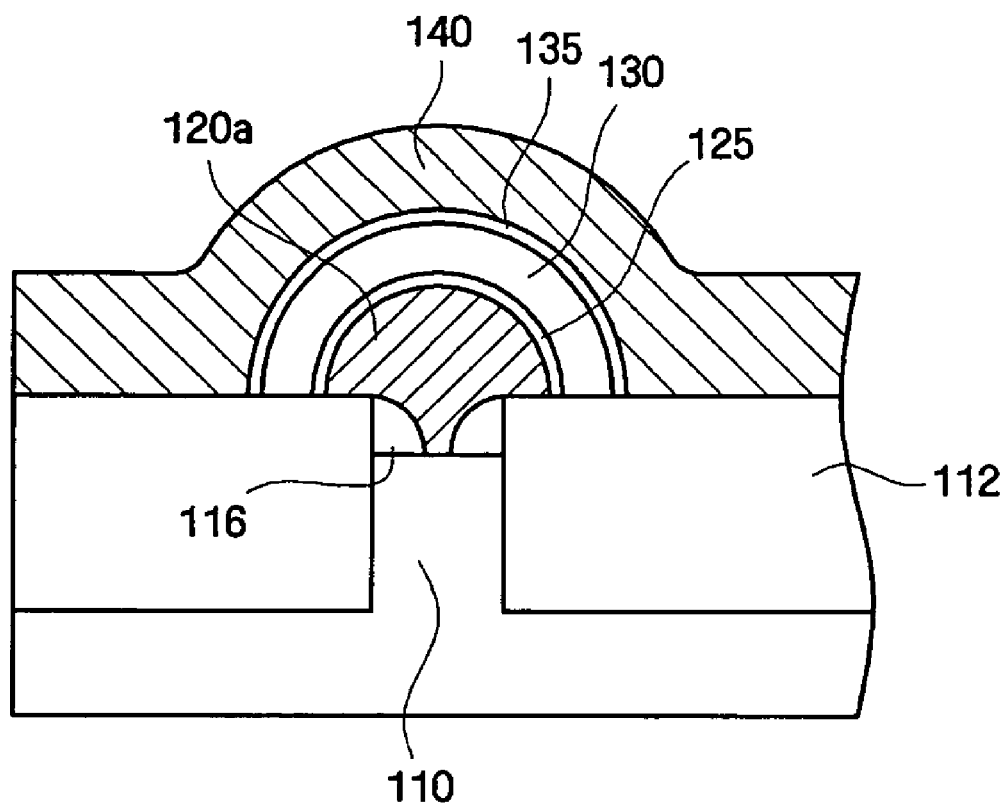

Referring to FIG. 8I, impurity ions are implanted into the semiconductor body 120a as needed, thereby performing a channel doping process for controlling the threshold voltage Vth. Thereafter, a tunneling insulating layer 125 is formed on the surface of the semiconductor body 120a. The tunneling insulating layer 125 can be produced by wet oxidation, HCl oxidation, or by an oxidation method using a gas mixture on the surface of the semiconductor body 120a and then by growing a desired layer. Alternatively, the CVD method or the ALD method can be used to form the tunneling insulating layer 125. For example, the tunneling insulating layer 125 can be formed of $SiO_2$, SiON, $Si_3N_4$, $Ge_xO_yN_z$, $Ge_xSi_yO_z$, or a high dielectric constant material such as $HfO_2$, $ZrO_2$, $Al_2O_3$, $Ta_2O_5$, hafnium silicate, zirconium silicate or a combination thereof. Further, the tunneling insulating layer 125 can be formed by stacking two or more layers formed of the above materials.

Thereafter, a floating gate 130 is formed over the tunneling insulating layer 125. The CVD method or the ALD method can be used to form the floating gate 130. The floating gate 130 can be formed using n+ polysilicon, p+ polysilicon, SiGe having a changeable work function, or a metallic material. Further, in the SONOS structure, a nitride layer ($Si_3N_4$) can be used as the floating gate 130. Here, a nitridation method is mainly used.

An intergate insulating layer 135 is formed over the floating gate 130. The intergate insulating layer 135 is formed by the same method as the tunneling insulating layer 125. Generally, the thickness of the intergate insulating layer 135 is slightly greater than that of the tunneling insulating layer 125.

Thereafter, a conductive layer is formed on the intergate insulating layer 135 and then patterned to form a control gate 140. The control gate 140 can be formed of conductive polysilicon, a metal, metal nitride, metal silicide or a combination thereof. The control gate 140 is conformally formed using the LPCVD method on a structure in which the floating gate 130 and others are stacked.

Finally, a spacer (not shown) is formed on a sidewall of the control gate 140 by a conventional method. Then, the ion-implantation process and the annealing process are performed to form source and drain regions.

A conventional salicide process is performed so that a metal silicide layer such as $WSi_x$, $CoSi_x$, $TiSi_x$ can be formed on an upper surface of the control gate 130 and on upper surfaces of the source and drain regions.

FIGS. 9A through 9D are cross-sectional views illustrating steps in a method of fabricating the nonvolatile semiconductor device according to the third embodiment of the present invention.

The method of fabricating the nonvolatile semiconductor device according to the third embodiment of the present invention shown in FIGS. 9A through 9D is substantially the same as that shown in FIGS. 8A through 8I, except that a semiconductor body is formed not on a bulk substrate but on an SOI substrate.

Figure 9A:
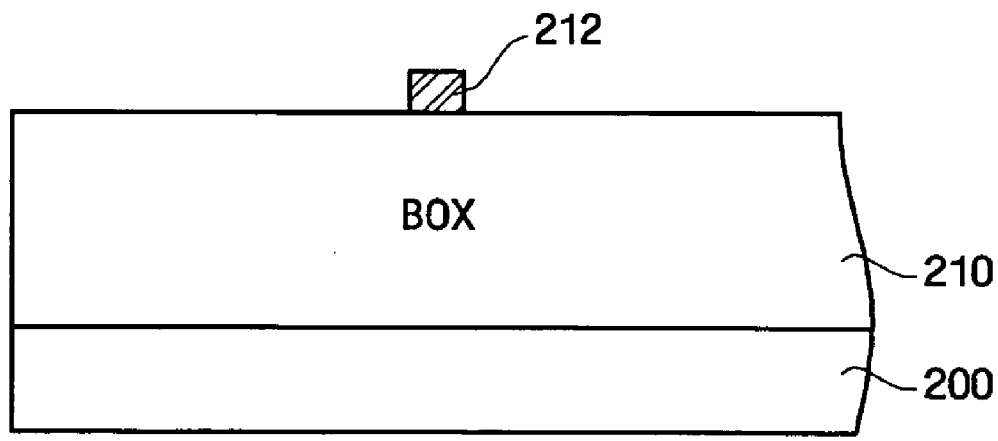
FIGS. 9A through 9D are cross-sectional views illustrating steps in a method of fabricating the nonvolatile semiconductor device according to the third embodiment of the present invention.

Referring to FIG. 9A, an SOI substrate is prepared comprising a silicon substrate 200, a buried oxide film 210 and a silicon layer that are sequentially stacked. The SOI substrate can be formed using a SIMOX process. The buried oxide film 210 has a thickness of about 1,000-1,500 Å.

The silicon layer is patterned to form a silicon fin 212 having a certain width according to the degree of scaling of the device to be fabricated. First, a portion of predetermined thickness of an upper surface of the silicon layer is removed using an oxidation process and a wet etching process, thereby reducing the thickness of the silicon layer. A photoresist pattern (not shown) having a fine width of about 0.3-40 nm is formed on the silicon layer. The silicon layer is patterned using the photoresist pattern to form the silicon fin 212.

Figure 9B:
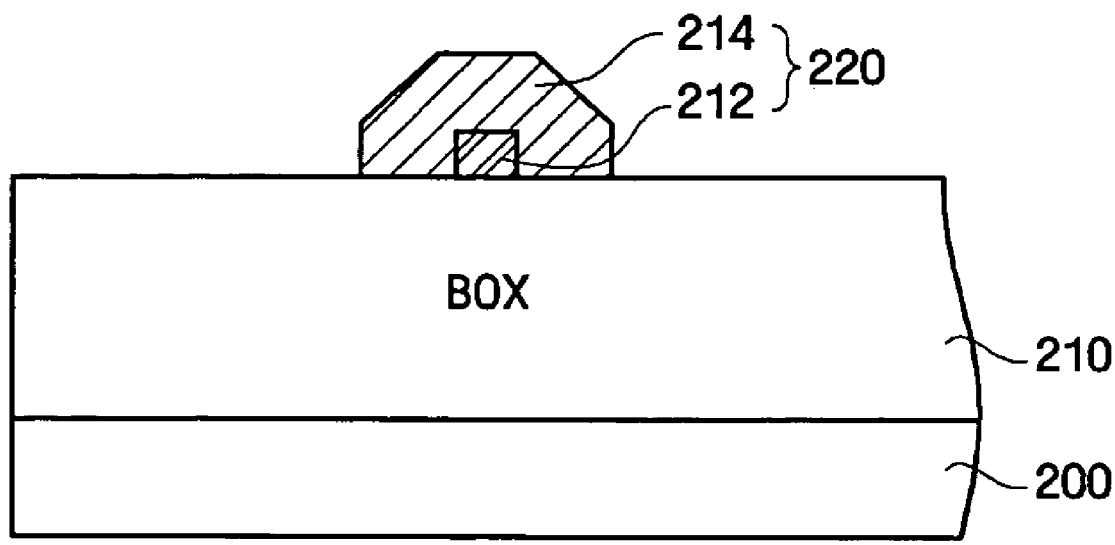

Referring to FIG. 9B, a semiconductor layer 214 is formed by a selective epitaxial growth method on the silicon fin 212 using the silicon fin 212 as a seed layer. The method for forming the semiconductor layer 214 is the same as the method shown in FIG. 8G.

Figure 9C:
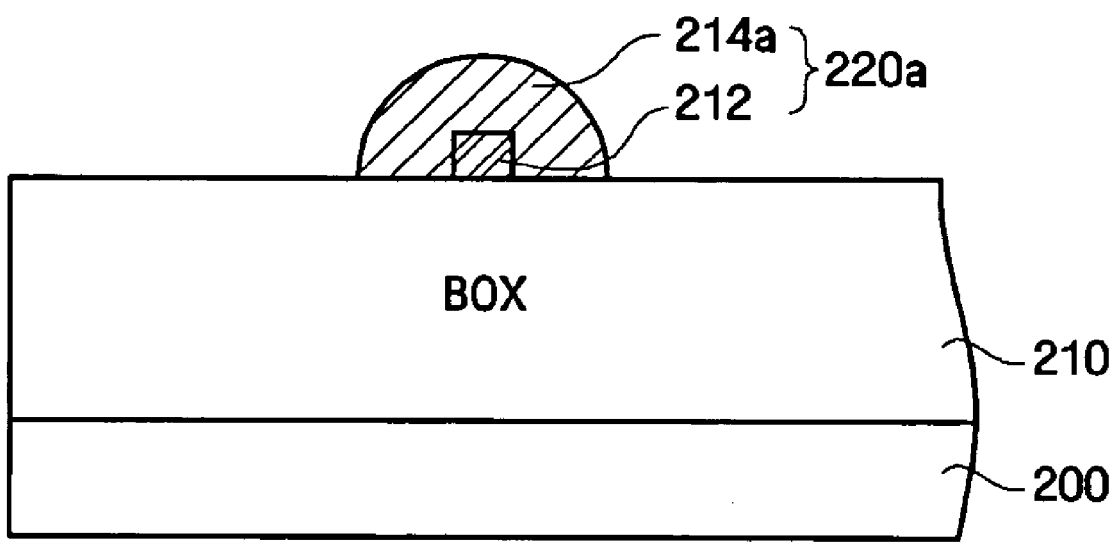

Referring to FIG. 9C, the annealing process is performed on the semiconductor layer 214 having a plurality of inclined planes in an $H_2$ atmosphere at a temperature of about 850-950° C. to form a semiconductor layer 214a having a cross section of a predetermined curvature. The silicon fin 212 and the semiconductor layer 214a formed by the annealing process constitute a semiconductor body 220a on which a channel region is to be formed.

Figure 9D:
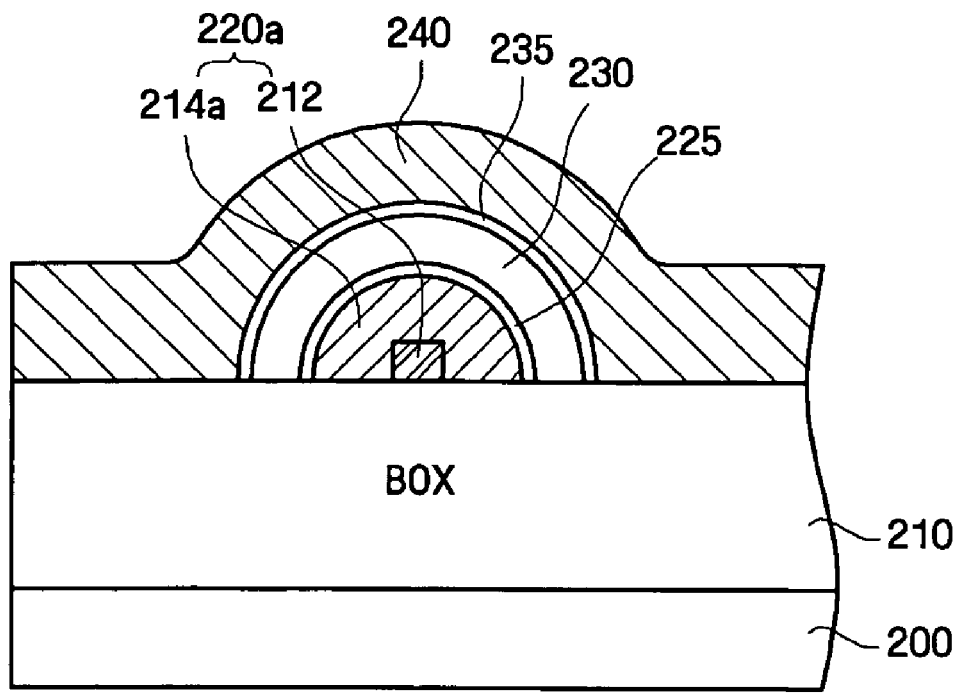

Referring to FIG. 9D, a channel doping process for controlling the threshold voltage Vth can be performed on the semiconductor body 220a as described in FIG. 8I. A tunneling insulating layer 225, a floating gate 230, an intergate insulating layer 235, and a control gate 240 are formed on the semiconductor body 220a, and source and drain regions are then formed.

FIGS. 10A through 10F are cross-sectional views illustrating steps in a method of fabricating the nonvolatile semiconductor device according to the fourth embodiment of the present invention.

Figure 10A:
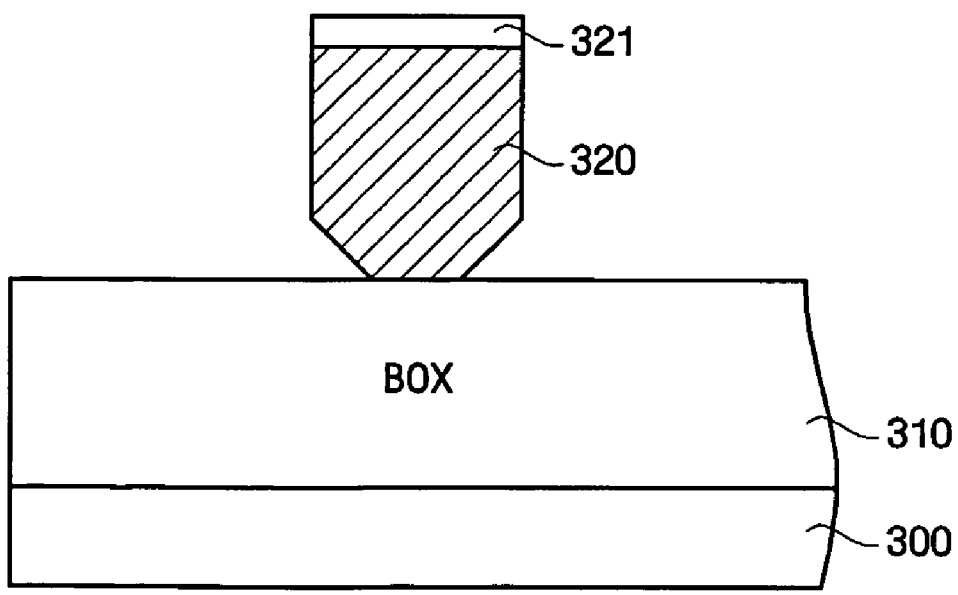
FIGS. 10A through 10F are cross-sectional views illustrating steps in a method of fabricating the nonvolatile semiconductor device according to the fourth embodiment of the present invention.

Referring to FIG. 10A, a semiconductor layer (not shown) in which an oxide layer (not shown) is grown is patterned to form a semiconductor body 320. Specifically, an insulating layer (used as a hard mask) is first deposited on the semiconductor layer in which the oxide layer is grown. The insulating layer is etched and then patterned using a photoresist. Thereafter, the semiconductor layer is etched using the insulating layer as an etching mask, thereby making it possible to form an oxide layer pattern 321 and the semiconductor body 320.

Alternatively, the photoresist is directly coated on the semiconductor layer (not shown) in which the oxide layer (not shown) is grown, and a photolithographic process is then performed. Thereafter, the semiconductor layer is dry etched, thereby making it possible to form the oxide layer pattern 321 and the semiconductor body 320. Subsequently, the remaining photoresist can be removed by ashing and stripping processes.

When using the etching process, an undercut is created on a lower portion of the semiconductor body 320. In particular, when using a reactive ion beam etch (RIE) process, an angle of an inclined sidewall of the undercut semiconductor body 320 can be controlled by controlling the etching time or the flow rate of a supply gas.

Also, although it is not shown in the drawings, a separate process can be performed to form an undercut on the lower portion of the semiconductor body 320. That is, the undercut can be formed on the lower portion of the semiconductor body 320 using a dry etching process, a wet etching process, or others.

Figure 10B:
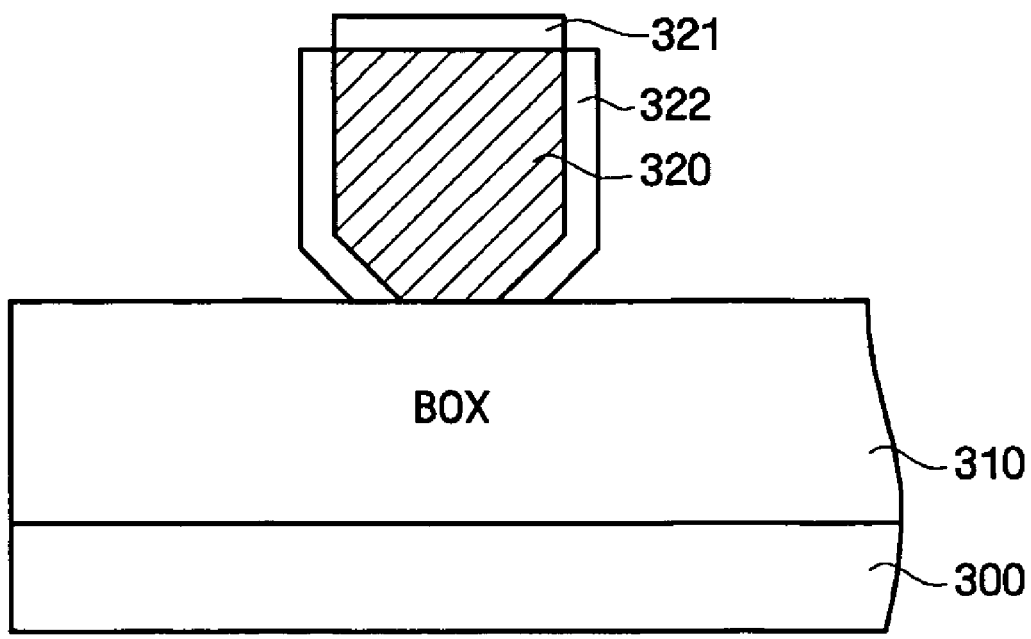

Referring to FIG. 10B, a sacrificial oxide layer 322 is grown using an oxidation process to protect the sidewall of the semiconductor body 320 during the wet etching process.

Figure 10C:
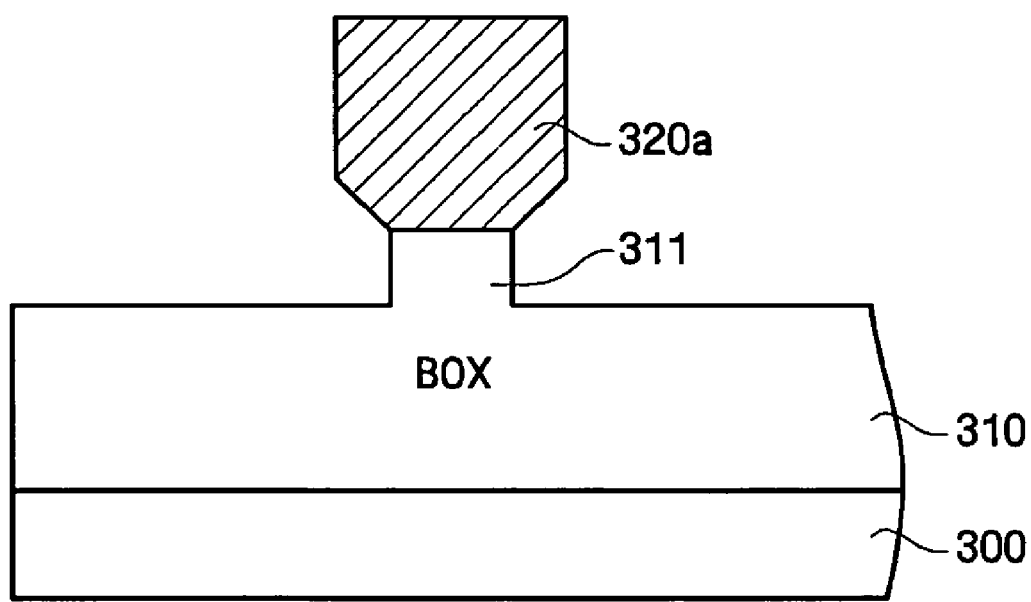

Referring to FIG. 10C, an etch-back process is performed as the wet etching process. Portions of the oxide layer pattern 321, the sacrificial oxide layer 322, and a buried oxide film 310 are etched by the etch-back process. In particular, an oxide layer fin 311 is formed on the lower portion of the semiconductor body 320.

Figure 10D:
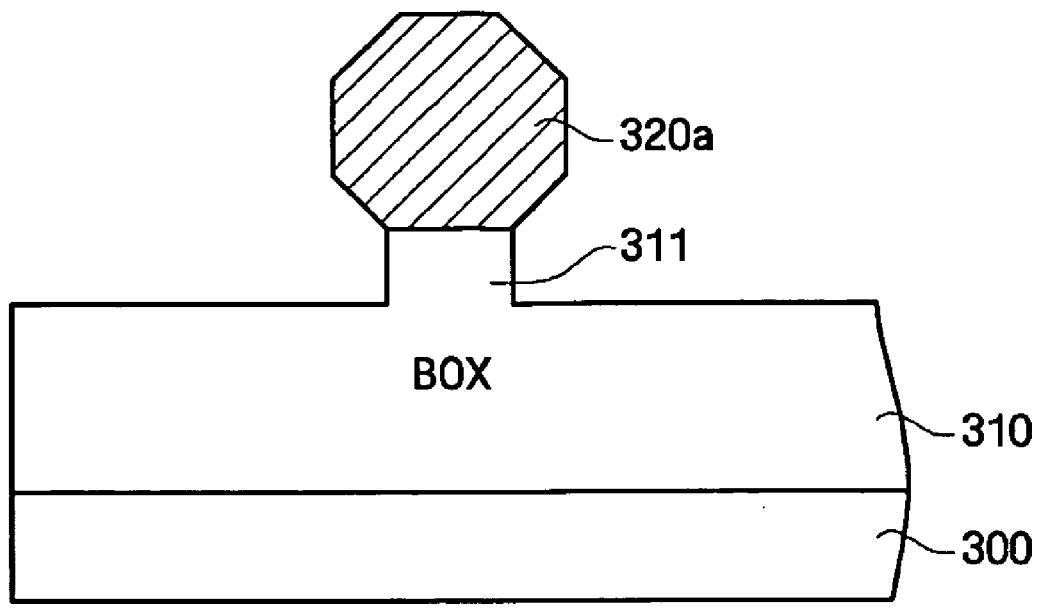

Referring to FIG. 10D, an annealing process is performed in an $H_2$ atmosphere to round the edges of an upper portion of the semiconductor body 320. Preferably, the $H_2$ annealing process is performed at a temperature of about 900° C. or less at a pressure of about 20 Torr or less for about 1-3 minutes.

Alternatively, a dry etch-back process can be performed on the resultant structure using the dry etching equipment of the RIE process. Since ions are concentrated at sharp corners of the semiconductor body 320 due to a characteristic of sputtering, the sharp corners are eroded so that the edges of the semiconductor body 320 become rounded.

Alternatively, the etch-back process is performed on the resultant structure using a wet etching process. Three-dimensional etching is performed on the edges of the semiconductor body 320 due to a characteristic of the wet etching process. Accordingly, since the amount of etching of the edge of the semiconductor body 320 is larger than that of the upper surface or the sidewall thereof, the edges of the semiconductor body 320 become rounded.

Figure 10E:
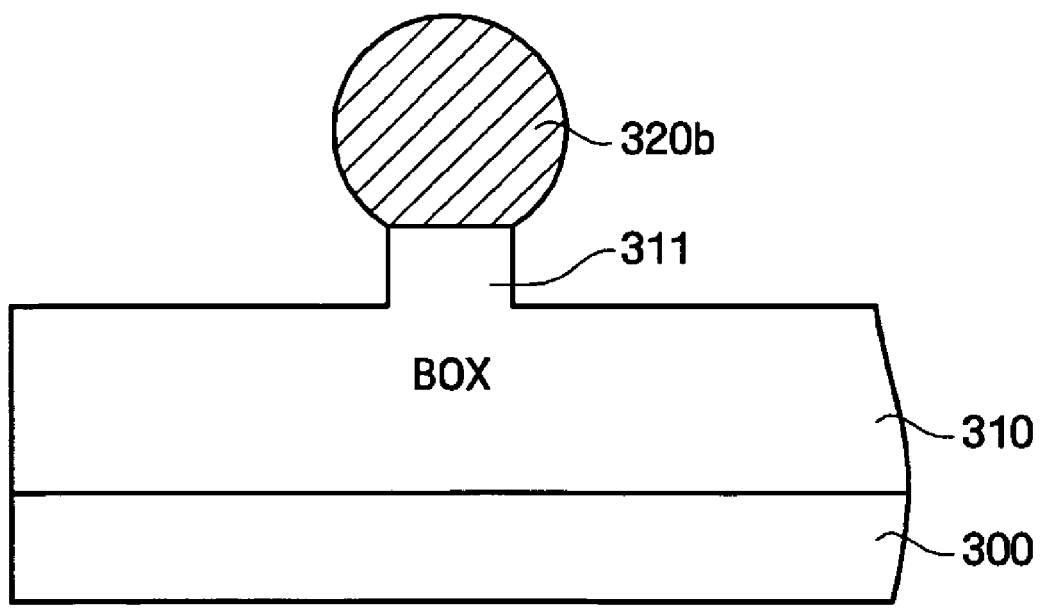

Referring to FIG. 10E, the annealing process is performed in an $H_2$ atmosphere to make the cross section of the semiconductor body 320a have a predetermined curvature. Preferably, the $H_2$ annealing process is performed at a temperature of about 850-950° C.

Figure 10F:
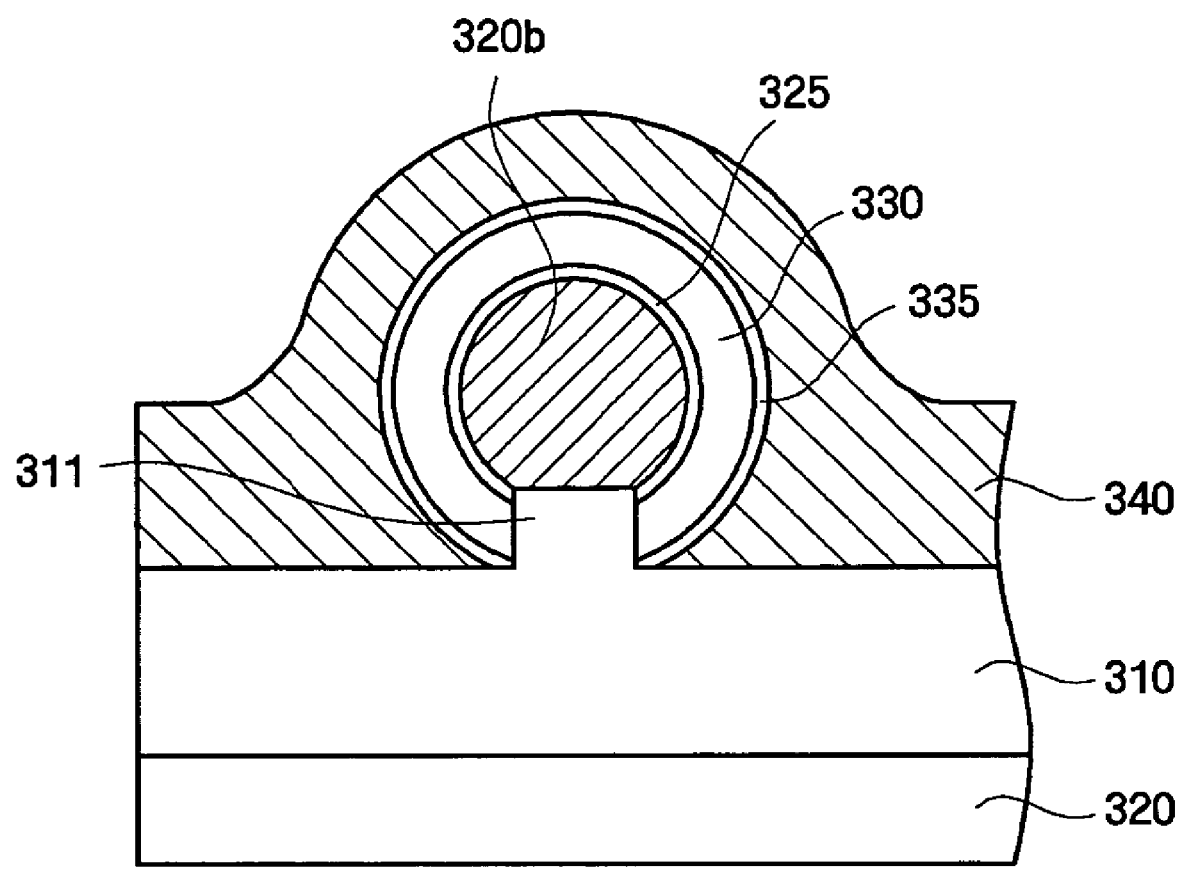

Referring to FIG. 10F, as described in FIG. 8I, a channel doping process for controlling the threshold voltage Vth can be performed on a semiconductor body 320b. A tunneling insulating layer 325, a floating gate 330, an intergate insulating layer 335, a control gate 340 are formed on the semiconductor body 320b, and source and drain regions are then formed.

The semiconductor body 320b is disposed over the oxide layer fin 311, and the tunneling insulating layer 325 covers sidewalls of the semiconductor body 320b and portions of the sidewalls of the oxide layer fin 311. Further, the floating gate 330 and/or the intergate insulating layer 335 can be formed on both sidewalls of the oxide layer fin 311, or on both sidewalls of the oxide layer fin 311 and on a portion of an upper surface of the buried oxide film.

Accordingly, since a cross section of the semiconductor body has a predetermined curvature, an electric field can be prevented from being concentrated in corners of the semiconductor body and a clean crystal plane can be used as a channel region. In addition, a sub-threshold characteristic and a current control capacity can be improved. Further, since a selective epitaxial growth technology is used, a three-dimensional active region can be formed and a clean crystal plane can be used as a channel region. Also, since a tunneling insulating layer is formed on a surface of the clean semiconductor body, impurities contained in the tunneling insulating layer are significantly reduced. Further, electrical properties of the nonvolatile semiconductor device are improved.

The nonvolatile semiconductor device and fabrication method thereof provide the following features.

First, since a cross section of the semiconductor body has a predetermined curvature, it is possible to prevent an electric field from being concentrated in corners of the semiconductor body and a clean crystal plane can be used as a channel region.

Second, a sub-threshold characteristic and a current control capacity can be improved.

Third, since a selective epitaxial growth technology is used, a three-dimensional active region can be formed and a clean crystal plane can be used as a channel region.

Fourth, since a tunneling insulating layer is formed on a surface of the clean semiconductor body, impurities contained in the tunneling insulating layer are reduced.

Fifth, electrical properties of the nonvolatile semiconductor device can be improved by increasing the channel length.

Although the present invention has been described in connection with the exemplary embodiments and may be embodied in many different forms, it will be apparent to those skilled in the art that various modifications and changes may be made thereto without departing from the scope and spirit of the invention. Therefore, it should be understood that the above embodiments are not limitative, but illustrative in all aspects.

What is claimed is:

1. A nonvolatile semiconductor device comprising:
a semiconductor body formed on a substrate, elongated in one direction and having a cross section perpendicular to a main surface of the substrate and to the elongated direction, the cross section having a predetermined curvature;
a channel region partially formed on the semiconductor body along the circumference of the semiconductor body;
a tunneling insulating layer disposed on the channel region;
a floating gate disposed on the tunneling insulating layer and electrically insulated from the channel region;
an intergate insulating layer disposed on the floating gate;
a control gate disposed on the intergate insulating layer and electrically insulated from the floating gate; and
source and drain regions which are adjacent to sides of the control gate and formed on the semiconductor body.

2. The nonvolatile semiconductor device of claim 1, wherein the semiconductor body is shaped in a semi-circle, a circle or an oval.

3. The nonvolatile semiconductor device of claim 1, wherein the predetermined curvature of the cross section of the semiconductor body is irregular.

4. The nonvolatile semiconductor device of claim 1, wherein the substrate is a bulk substrate.

5. The nonvolatile semiconductor device of claim 4, further comprising device isolation regions disposed at both sides of a lower portion of the semiconductor body to define a region of the semiconductor body.

6. The nonvolatile semiconductor device of claim 5, wherein the semiconductor body is formed on a semiconductor fin interposed between the device isolation regions and filling a portion of a space between the device isolation regions.

7. The nonvolatile semiconductor device of claim 1, wherein the substrate is a silicon-on-insulator (SOI) substrate.

8. The nonvolatile semiconductor device of claim 7, wherein the semiconductor body is disposed over a buried oxide film of the SOI substrate.

9. The nonvolatile semiconductor device of claim 8, wherein the semiconductor body includes a silicon fin formed on the substrate and a semiconductor layer formed on the silicon fin by a selective epitaxial growth method.

10. The nonvolatile semiconductor device of claim 1, wherein the substrate is made of Si, Ge, SiGe, GaAs, SiC, SiGeC, InAs, InP or a combination thereof.

11. The nonvolatile semiconductor device of claim 1, wherein the semiconductor body is made of Si, Ge, $Si_{1-x}Ge_x$ (0<x<1), $Si_{1-x}C_x$ (0<x<1), $Si_{1-x-y}Ge_xC_y$ (0<x<1, 0<y<1), GaAs, InSb, GaP or a combination thereof.

12. The nonvolatile semiconductor device of claim 1, wherein the semiconductor body is formed of a plurality of semiconductor layers having different band gaps.

13. The nonvolatile semiconductor device of claim 1, wherein the floating gate is made of n+ polysilicon, p+ polysilicon, SiGe having a changeable work function, a metallic material or a combination thereof.

14. The nonvolatile semiconductor device of claim 1, wherein the tunneling insulating layer is an oxide layer, the floating gate is a nitride layer ($Si_3N_4$), and the intergate insulating layer is an oxide layer.

15. The nonvolatile semiconductor device of claim 1, further comprising a blocking insulating layer formed between the substrate and the semiconductor body to define a contact region.

16. The nonvolatile semiconductor device of claim 15, wherein the blocking insulating layer is shaped in the form of a spacer for covering sidewalls of the device isolation regions.

17. The nonvolatile semiconductor device of claim 1, wherein the control gate surrounds the circumference of the semiconductor body.

18. The nonvolatile semiconductor device of claim 1, wherein the semiconductor body is formed over an oxide layer fin formed on the substrate, the floating gate is formed on the tunneling insulating layer and a sidewall of the oxide layer fin, and the control gate is formed along the intergate insulating layer and an upper portion of the substrate.

19. The nonvolatile semiconductor device of claim 18, wherein the substrate is a silicon-on-insulator (SOI) substrate.

20. The nonvolatile semiconductor device of claim 19, wherein the oxide layer fin is formed by etching a buried oxide film of the SOI substrate.

21. The nonvolatile semiconductor device of claim 18, wherein the floating gate is made of at least one selected from the group consisting of n+ polysilicon, p+ polysilicon, SiGe having a changeable work function, a metallic material and a nitride layer ($Si_3N_4$).

22. The nonvolatile semiconductor device of claim 18, wherein the tunneling insulating layer is an oxide layer, the floating gate is a nitride layer ($Si_3N_4$), and the intergate insulating layer is an oxide layer.

23. The nonvolatile semiconductor device of claim 18, wherein the control gate surrounds the circumference of the semiconductor body.

24. A method of fabricating a nonvolatile semiconductor device comprising:
   forming a semiconductor body on a substrate, elongated in one direction and having a cross section perpendicular to a main surface of the substrate and to the elongated direction, the cross section having a predetermined curvature; forming a tunneling insulating layer on the semiconductor body;
   forming a floating gate, which is electrically insulated from the semiconductor body, on the tunneling insulating layer;
   forming an intergate insulating layer on the floating gate;
   forming a control gate, which is electrically insulated from the floating gate, on the intergate insulating layer; and
   forming source and drain regions, which are aligned with both sides of the control gate, within the semiconductor body.

25. The method of claim 24, wherein the forming of the semiconductor body comprises:
   forming the semiconductor body, which contains channels formed on a plurality of planes, by a selective epitaxial growth method using a semiconductor fin formed on the substrate as a seed layer; and
   performing an annealing process on the semiconductor body so that the semiconductor body has a cross section of the perpendicular to a main surface of the substrate and elongated direction, the cross section having a predetermined curvature.

26. The method of claim 25, wherein the annealing process is performed in an $H_2$ atmosphere.

27. The method of claim 25, wherein the annealing process is performed at a temperature of about 850-950° C.

28. The method of claim 25, wherein the semiconductor body includes five planes or seven planes facing different directions.

29. The method of claim 28, wherein the semiconductor body, which contains channels formed on five planes, includes a first surface perpendicular to the main surface of the substrate, a second surface parallel to the main surface of the substrate, and a third surface including a {111} crystal plane or a {311} crystal plane.

30. The method of claim 28, wherein the semiconductor body, which contains channels formed on seven planes, includes a first surface perpendicular to the main surface of the substrate, a second surface parallel to the main surface of the substrate, a third surface including a {111} crystal plane, and a fourth surface including a {311} crystal plane.

31. The method of claim 25, further comprising:
   etching a portion of the substrate to form a trench for defining the semiconductor fin; and
   filling the trench with an insulating material to form a device isolation region around the semiconductor fin.

32. The method of claim 25, further comprising forming a blocking insulating layer covering a portion of an upper surface of the semiconductor fin before forming the semiconductor body.

33. The method of claim 24, wherein the semiconductor body is formed over an oxide layer fin formed on the substrate, the floating gate is formed on the semiconductor body and a sidewall of the oxide layer fin, and the control gate is formed along the intergate insulating layer and an upper portion of the substrate.

34. The method of claim 33, wherein the forming of the semiconductor body comprises:
   undercutting a lower portion of the semiconductor body, which contains channels formed on three planes;
   rounding the edges of an upper portion of the undercut semiconductor body; and
   annealing the rounded semiconductor body.

35. The method of claim 34, further comprising forming an oxide layer on a sidewall of the undercut semiconductor body and an undercut region before rounding the edges of the upper portion of the semiconductor body.

36. The method of claim 34, wherein the edges of the upper portion of the semiconductor body are rounded by at least one process selected from dry etching, wet etching and annealing.

37. The method of claim 35, wherein the substrate is a silicon-on-insulator (SOI) substrate having a buried oxide film, and the oxide layer fin is formed by wet etching the buried oxide film of the SOI substrate.

38. A nonvolatile semiconductor device comprising:
   a semiconductor body elongated in one direction on a substrate, and having a cross section perpendicular to a main surface of the substrate and to the elongated direction, the cross section having a predetermined curvature;
   a channel region partially formed on the semiconductor body along the circumference of the semiconductor body;

a tunneling insulation disposed on the channel region;

a floating gate disposed on the tunneling insulating layer, and electrically insulated from the channel region;

a high dielectric constant material layer disposed on the floating gate;

a metallic control gate disposed on the material having the high dielectric constant and electrically insulated from the floating gate; and source and drain regions that are adjacent to sides of the control gate and formed on the semiconductor body.

39. The nonvolatile semiconductor device of claim 38, wherein the cross section of the semiconductor body is shaped in one of a semi-circle, a circle, or an oval.

40. The nonvolatile semiconductor device of claim 38, wherein the substrate is a bulk substrate or a silicon-on-insulator (SOI) substrate.

41. The nonvolatile semiconductor device of claim 38, wherein the floating gate is a nitride layer ($Si_3N_4$).

42. The nonvolatile semiconductor device of claim 38, wherein the high dielectric constant material layer is a combination of hafnium oxide ($HfO_2$), zirconium oxide ($ZrO_4$), aluminum oxide ($Al_2O_3$), tantalum oxide ($Ta_2O_5$), hafnium silicate (HfSiO), and zirconium silicate ($O_4SiZr$).

43. The nonvolatile semiconductor device of claim 38, wherein the metallic control gate is made of a metal, metal nitride, metal silicide, or a combination thereof.

* * * * *